United States Patent
Shin et al.

(10) Patent No.: US 6,784,481 B2
(45) Date of Patent: Aug. 31, 2004

(54) FLASH MEMORY DEVICE WITH ISOLATION REGIONS AND A CHARGE STORAGE DIELECTRIC LAYER FORMED ONLY ON AN ACTIVE REGION

(75) Inventors: You-Cheol Shin, Kyunggi-do (KR); Jong-Woo Park, Seoul (KR); Jung-Dal Choi, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/098,875

(22) Filed: Mar. 15, 2002

(65) Prior Publication Data

US 2002/0130350 A1 Sep. 19, 2002

(30) Foreign Application Priority Data

Mar. 17, 2001 (KR) .......................................... 2001-13931

(51) Int. Cl.[7] .......................... H01L 29/76; H01L 21/336
(52) U.S. Cl. ........................ 257/314; 257/298; 257/315; 257/316; 438/262; 438/257
(58) Field of Search ........................ 257/298, 314–323, 257/903; 438/254, 257, 258, 261–262, 264, 266–267, 593, 594

(56) References Cited

U.S. PATENT DOCUMENTS

| | | | |
|---|---|---|---|
| 5,929,480 A | * | 7/1999 | Hisamune .................... 257/320 |
| 6,190,989 B1 | * | 2/2001 | Roberts ....................... 438/264 |
| 6,468,865 B1 | * | 10/2002 | Yang et al. .................. 438/262 |

* cited by examiner

*Primary Examiner*—David Nelms
*Assistant Examiner*—Long Tran
(74) *Attorney, Agent, or Firm*—Marger Johnson & McCollm, P.C.

(57) ABSTRACT

A flash memory having a charge-storage dielectric layer. According to one embodiment, charge-storage dielectric layers are formed over the first and second active regions. The charge-storage layer over the first active region is not connected to the charge-storage layer over the second active region. A gate line overlies the charge-storage layer and extends across the first and second active regions and the isolation region. The charge-storage layer can be formed only where a gate line intersects an active region of a semiconductor substrate, not on an isolation region. Thus, undesirable influence or disturbance from adjacent memory cells can be avoided.

9 Claims, 9 Drawing Sheets

FLASH MEMORY DEVICE WITH ISOLATION REGIONS AND A CHARGE STORAGE DIELECTRIC LAYER FORMED ONLY ON AN ACTIVE REGION

This application claims priority from Korean Patent Application No. 2001-13931, filed on Mar. 17, 2001, the contents of which are incorporated herein by reference in their entirety.

BACKGROUND OF THE INVENTION

1. Field of the Invention

The present invention relates to a semiconductor memory device and a method for fabricating the same and, more particularly, to a flash memory device having a charge-storage dielectric layer and a method for manufacturing the same.

2. Description of the Related Art

A flash memory device including a charge-storage dielectric layer, such as SONOS (Silicon-Oxide-Nitride-Oxide-Semiconductor) memory device, is typically composed of a polysilicon gate electrode, source and drain electrodes at both sides of the polysilicon gate electrode, and an ONO (Oxide-Nitride-Oxide) triple dielectric layer interposed between a semiconductor substrate and the polysilicon gate electrode as a charge-storage layer.

A conventional SONOS device structure is schematically shown in FIGS. 1, 2A, and 2B. FIG. 1 is a perspective view of the conventional SONOS device, FIG. 2A a cross-sectional view taken along the line 1A–1A' in FIG. 1, and FIG. 2B is a cross-sectional view taken along the line 1B–1B' in FIG. 1. Referring to FIGS. 1 to 2B, the conventional SONOS device includes an ONO layer 112 including a lower oxide layer 106—a nitride layer 108—an upper oxide layer 110 over a silicon semiconductor substrate 100, and a polysilicon gate line 114 formed on the ONO layer 112. However, the ONO layer 112 is formed not only on active regions 104 intersecting the gate line 114, but also on isolation regions 102 electrically isolating the active regions 104. That is, the ONO layer is formed on the entire regions (active region and isolation region) under the gate line 114.

For the SONOS flash memory device, there are several main modes of operation, for example, Programming, Erasing, and Reading. In the programming mode, a program voltage Vpp is applied to the gate line 114. If a source region 116a formed on an active region at one side of the gate line 114, and a drain region 116b formed on an active region at the other side of the gate line 114 are grounded to a semiconductor substrate 100, some of the electrons from the semiconductor substrate 100 tunnel through the lower oxide layer 106 by a F-N (Fowler-Nordheim) tunneling mechanism and are injected into the nitride layer 108. Accordingly, a threshold voltage of the transistor becomes high enough to program data.

For the erasing mode, the gate line 114, the drain region 116b, and the source region 116a are opened, and the program voltage Vpp is applied to the substrate 100. Then, the electrons injected (trapped) within the nitride layer 108 are forced into the substrate 100. Accordingly, the threshold voltage becomes low, thereby erasing the data.

Further, in the reading mode, a reading voltage Vr is applied to the gate line 114, and a current between the source 116a and the drain 116b is detected. By using a sensing circuit measuring the current during an application of the reading voltage Vr, it is possible for a reading operation to be performed on a specific memory cell.

However, as semiconductor devices become more highly integrated, a topological size of an active region and an isolation region inevitably becomes narrower, decreasing a spacing between adjacent cells. As described above, because the SONOS flash memory device traps electrons within the ONO layer 112, especially, the nitride layer 108, or by releasing the trapped electrons, data loss can easily occur in the conventional SONOS flash memory device because the ONO layer is formed not only on the active regions 104, but also on the isolation regions 102. With the conventional SONOS device, adjacent cells are thus interconnected thorough the ONO layer. Furthermore, if the spacing between the adjacent cells becomes narrower, the electrons trapped in the ONO layer formed on the narrow isolation region may undesirably influence the flash memory operations.

SUMMARY OF THE INVENTION

The present invention provides a flash memory device preventing disturbances caused by adjacent cells during a memory cell operation.

According to an embodiment the present invention, adjacent isolation regions formed on a semiconductor substrate. The adjacent isolation regions define an active region therebetween. A charge-storage dielectric layer is formed only on the active region. A gate line overlies the charge-storage layer and intersects the isolation regions and the active region.

According to another embodiment of the present invention, a method for forming the flash memory device includes forming a charge-storage dielectric layer on a semiconductor substrate. The charge-storage dielectric layer is patterned to expose regions of the semiconductor substrate. Isolation regions are formed in the exposed regions of the semiconductor substrate. The isolation regions define active regions therebetween. The patterned charge-storage dielectric layer is self-aligned with the isolation regions. A conductive layer overlies the patterned charge-storage dielectric layer. The conductive layer and the patterned charge-storage layer are patterned to form gate lines overlying the patterned charge-storage layer and extending across the active regions. Preferably, the charge-storage layer is formed only on the active region and includes a lower oxide layer, a nitride layer, and an upper oxide layer (ONO layer) sequentially staked on the semiconductor substrate.

BRIEF DESCRIPTION OF THE DRAWINGS

The present invention will be more clearly understood from the following description with reference to the accompanying drawings, wherein.

DESCRIPTION OF THE PREFERRED EMBODIMENT

Referring to FIGS. 3 to 6C, an embodiment of the present invention will be described below.

The present invention contemplates a semiconductor memory device including a charge-storage layer, such as an ONO (oxide-nitride-oxide) layer. The ONO layer is interposed between a semiconductor substrate and a gate line, and carriers from the substrate are injected and trapped in the nitride layer of the ONO layer, changing a threshold voltage.

Figure 1:
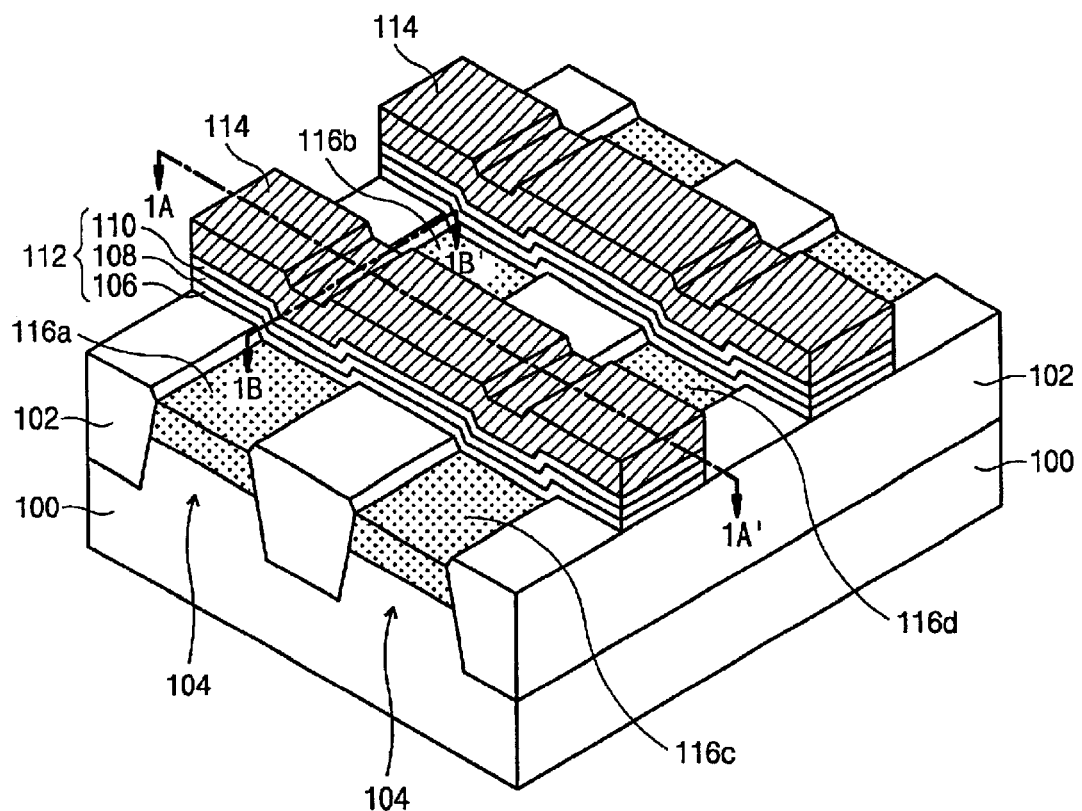
FIG. 1 is a perspective view schematically illustrating a conventional SONOS flash memory device.
Figure 2A:
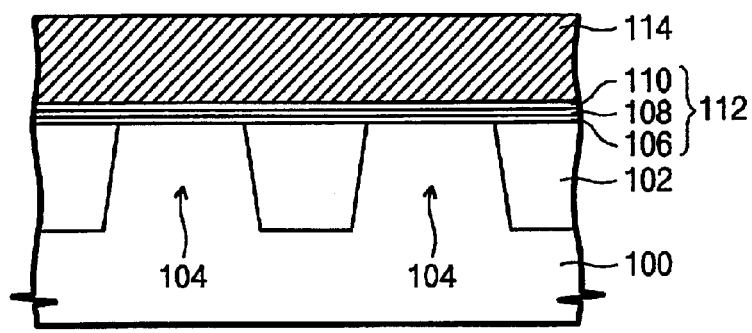
FIG. 2A is a cross-sectional view taken along the line 1A–1A' in FIG. 1.
Figure 2B:
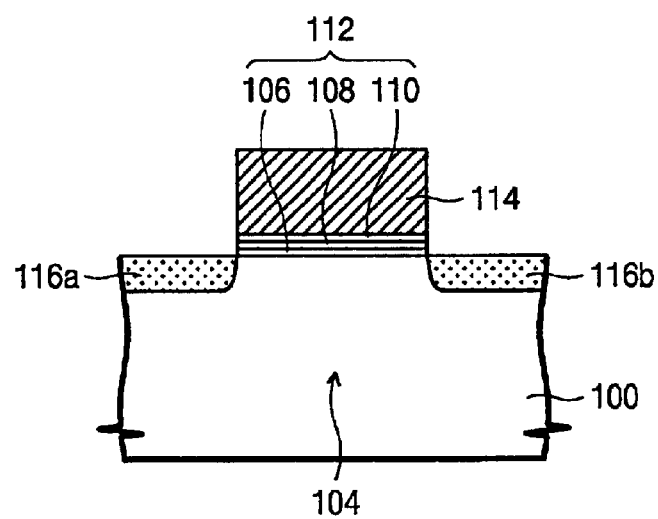
FIG. 2B is a cross-sectional view taken along the line 1B–1B' in FIG. 1.
Figure 3:
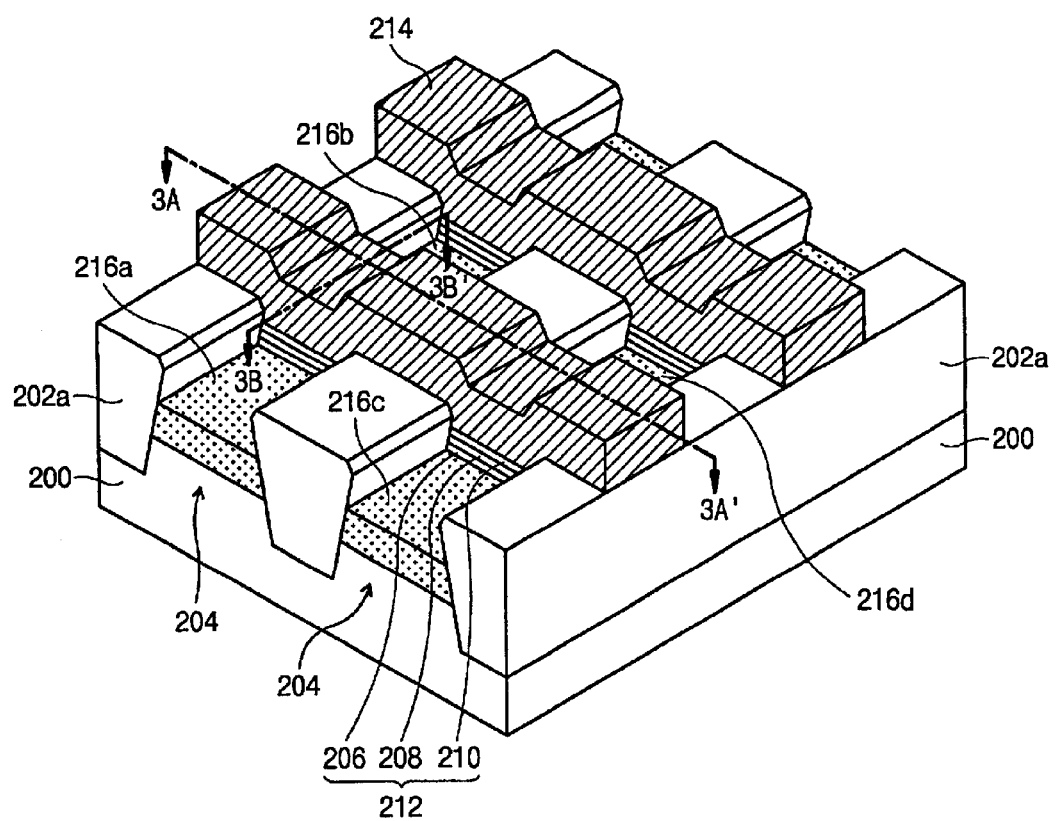
FIG. 3 is a perspective view illustrating a SONOS flash memory device in accordance with an embodiment of the present invention.
Figure 4A:
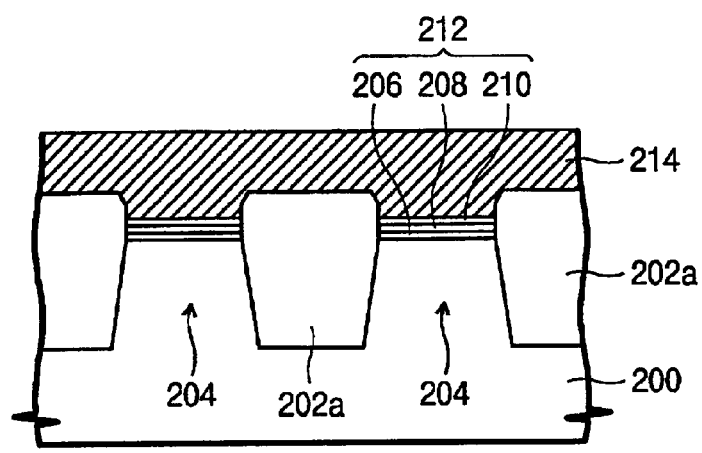
FIG. 4A is a cross-sectional view taken along the line 3A–3A' in FIG. 3.
Figure 4B:
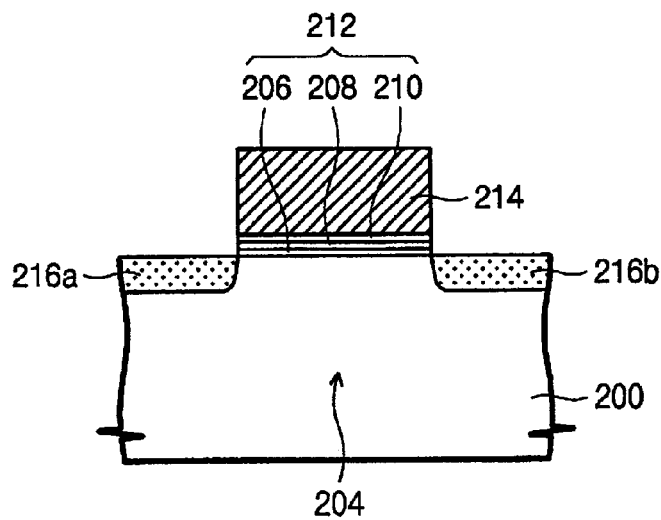
FIG. 4B is a cross-sectional view taken along the line 3B–3B' in FIG. 3.

FIG. 3 is a perspective view illustrating a SONOS flash memory device in accordance with an embodiment of the present invention, FIG. 4A is a cross-sectional view taken along the line 3A–3A' in FIG. 3, and FIG. 4B is a cross-sectional view taken along the line 3B–3B' in FIG. 3.

One aspect of the present invention is that charge-storage layers over adjacent active regions are not connected. Thus, adjacent cells are not interconnected through the charge-storage layer as in the prior art. According to an embodiment of the present invention as shown in FIGS. 3, 4A, and 4B, this is accomplished by forming a charge-storage layer or a charge-storage layer 212 only on a portion of an active region 204, specifically, the region intersected by the active region 204 and a gate line 214.

Referring to FIG. 3, the SONOS flash memory device in accordance with an embodiment of the present invention includes a plurality of isolation regions 202a on a predetermined region of a semiconductor substrate 200. The plurality isolation regions 202a are parallel with each other, and regions therebetween define the active regions 204. Therefore, plural active regions 204 are formed parallel with each other. A plurality of gate lines 214 are formed across the top surface of the isolation regions 202a and the active regions 204. Source/drain regions 216a–d as impurity diffusion regions are formed on the active region 204 located between the gate lines 214.

According to a preferred embodiment of the present invention, the charge-storage layer 212 is formed only on the intersection area of the plurality of gate lines 214 and the active regions 204. That is, the isolation region 202a can be directly contacted with the gate line 214 without the charge-storage layer 212 interposed therebetween. As a result, because the charge-storage layer 212 is not formed on the isolation region 202a, undesirable influence (disturbance) from adjacent cells can be minimized during an operation of the SONOS memory device, even when pitches of the active and the isolation regions is decreased due to high integration of the memory device.

A method for forming the SONOS flash memory device shown in FIGS. 3, 4A, and 4B will be described in detail.

FIGS. 5A to 5F are cross-sectional views of various stages of processing steps for forming an SONOS flash memory device shown in FIG. 3 in accordance an embodiment of the present invention taken along the line 3A–3A'.

Figure 5A:
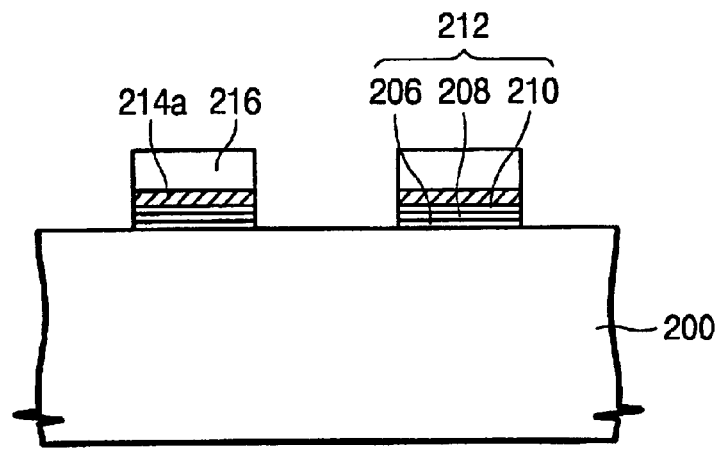
FIGS. 5A to 5F are cross-sectional views showing various stages of processing steps for forming a SONOS flash memory device shown in FIG. 3 in accordance with an embodiment of the present invention taken along the line 3A–3A'.

First, referring to FIG. 5A, the charge-storage layer 212 is formed on the semiconductor substrate 200. The charge-storage layer 212 is preferably formed of an ONO layer where a lower oxide layer 206, a nitride layer 208, and an upper oxide layer 210 are sequentially formed on the semiconductor substrate 200. For example, the lower oxide layer 206 is formed to a thickness of less than about 80 Å, the nitride layer 208 is formed to a thickness of less than about 100 Å, and the upper oxide layer 210 is formed to a thickness of less than about 200 Å. A lower conductive layer 214a is formed on the charge-storage layer 212. The lower conductive layer 214a formed of doped polysilicon is patterned in a following process, and is used as a part of the gate line. An etching mask layer 216 is formed on the lower conductive layer 214a. The etching mask layer 216 formed of silicon nitride may be used as a planarization stop layer in the following planarizing process.

Then, the etching mask layer 216, the lower conductive layer 214a, and the charge-storage layer 212 are patterned to expose a region of the semiconductor substrate surface to form isolation regions that define active regions 204. Consequently, the substrate covered with the charge-storage layer 212 and the lower conductive layer 214a becomes the active regions 204. Therefore, the charge-storage layer 212 and the lower conductive layer 214a are formed on the active regions 204 self-aligned with the isolation regions to be formed.

If necessary, the lower conductive layer 214a may not be formed, and an oxide mask layer can be additionally formed on the etching mask layer 216.

Figure 5B:
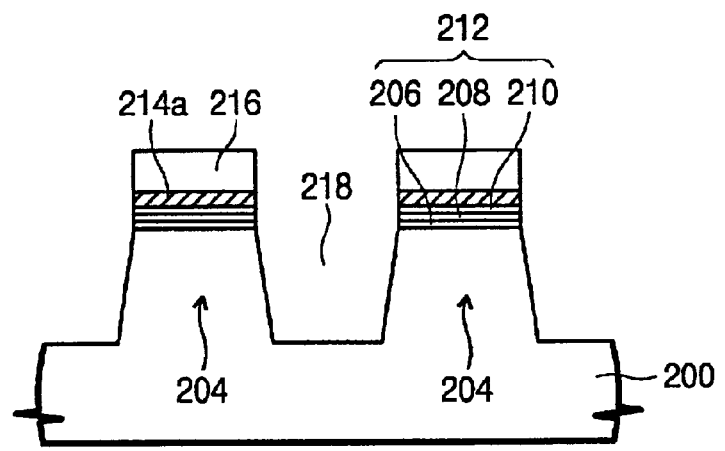

Referring to FIG. 5B, the exposed substrate is etched using the patterned etching mask layer 216 so that a plurality of trenches 218 are formed in parallel with each other. As a result, the active regions 204 between trenches also extend parallel with each other (See FIGS. 4A and 4B).

Figure 5C:
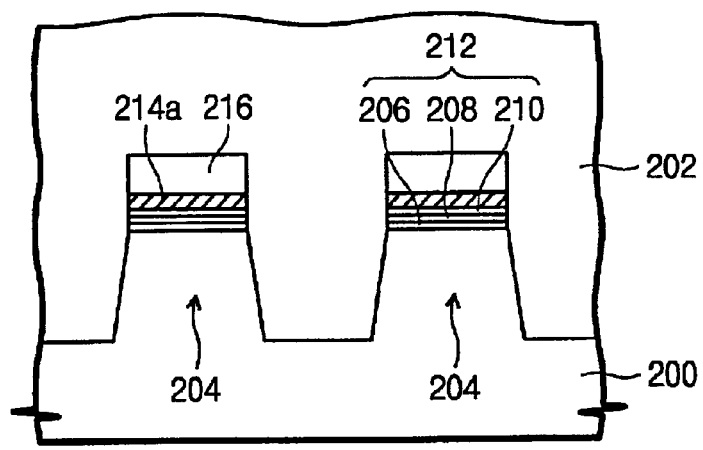
Figure 5D:
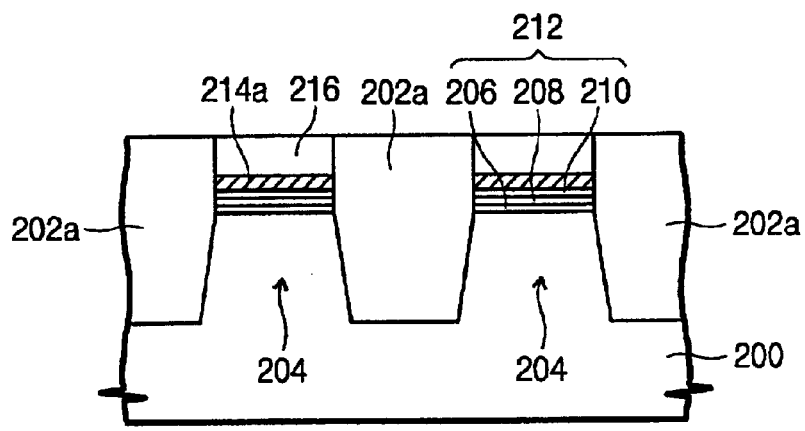

Referring to FIG. 5C, a trench-filling insulating layer 202 is deposited on the patterned etching mask layer 216 and within the trenches 218 to fill the trenches 218. The trench-filling insulating layer 202 is formed of a chemical vapor deposition oxide layer. If necessary, the resulting structure is heat-treated to densify the trench-filling insulating layer 202 within the trenches 218. Further, a thermal oxide layer and a nitride liner can be also formed overlying the trench 218. The thermal oxide layer cures etching damage to the semiconductor substrate during the formation of the trenches 218. The nitride liner prevents further oxidation of the inside of the trenches 218.

Until the patterned etch mask layer 216 is exposed, the trench-filling insulating layer 202 is planarized to form plural trench isolation regions 202a.

Figure 5E:
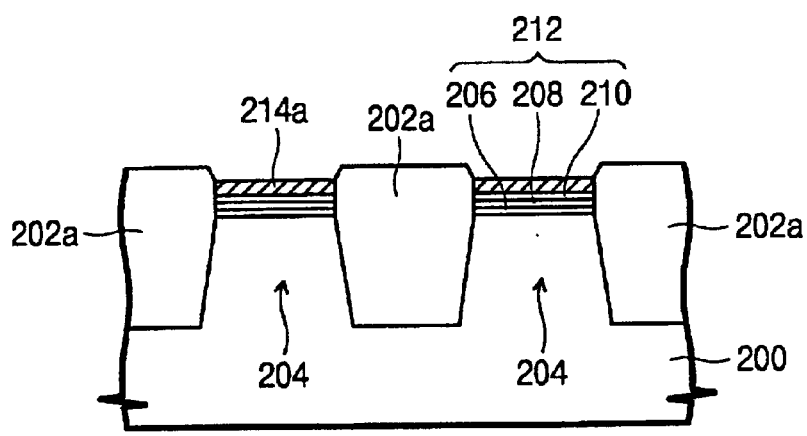

Referring to FIG. 5E, the exposed and patterned etch mask layer 216 is removed, but the charge-storage layer 212 and the lower conductive layer 214a formed on the active region 204 are left.

According an embodiment of the present invention, concurrently with an isolation process, the charge-storage layer 212 and the lower conductor layer 214a used as a part of the gate line is formed only on the active region self-aligned with the isolation regions 202a. That is, the charge-storage layer and the lower conductive layer are not formed on the isolation regions 202a. Therefore, an additional photolithography process is not required to remove the charge-storage layer 212 from the isolation regions 202a.

Then, the upper conductive layer for forming the gate line is deposited over the patterned lower conductive layer 214a and on the isolation regions 202a.

Figure 5F:
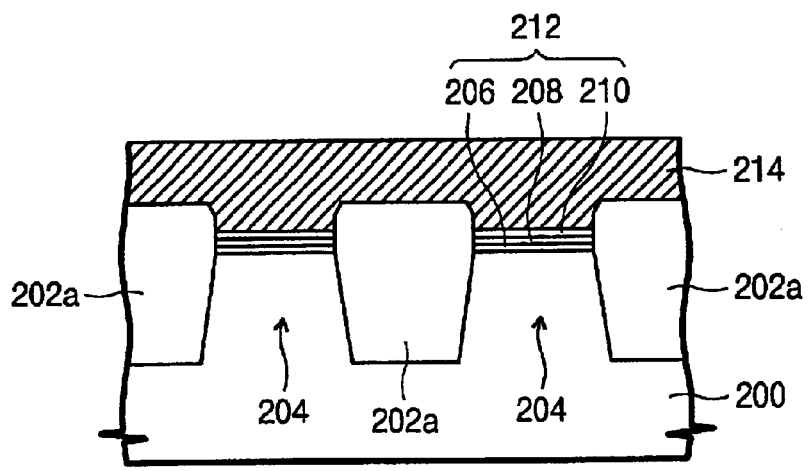

As shown FIGS. 3 and 5F, the upper conductive layer and the patterned lower conductive layer 214a are patterned, and a plurality gate lines 214 are formed to intersect top surface of the active regions 204 and the isolation regions 202a. As a result, the gate lines 214 may contact directly with the isolation regions 202a, and the charge-storage layer 212 is formed on a portion of the active regions 204, only where the active region 204 and the gate line 214 intersect so that the charge-storage layers 212 are isolated from each other. The lower conductive layer 214a becomes a part of the gate lines 214. Then, source/drain regions 216a to 216d are formed on the active region 204 at both sides of the gate line 214.

A method for forming a memory device in accordance with another embodiment of the present invention will be described herein below. This embodiment is similar to the embodiment discussed above except that isolation regions are formed by a local oxidation of silicon (LOCOS) technique instead of trench isolation techniques.

Figure 6A:
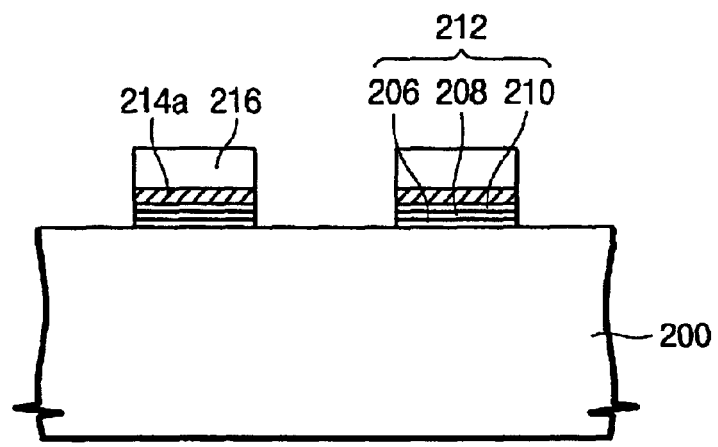
FIGS. 6A to 6C are cross-sectional views showing various stages of processing steps for forming a SONOS flash memory device shown in FIG. 3 in accordance with other embodiment of the present invention taken along the line 3A–3A'.
Figure 6B:
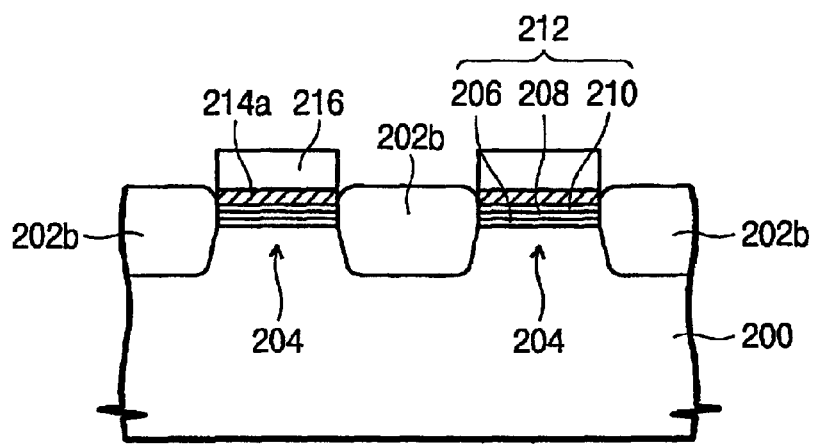
Figure 6C:
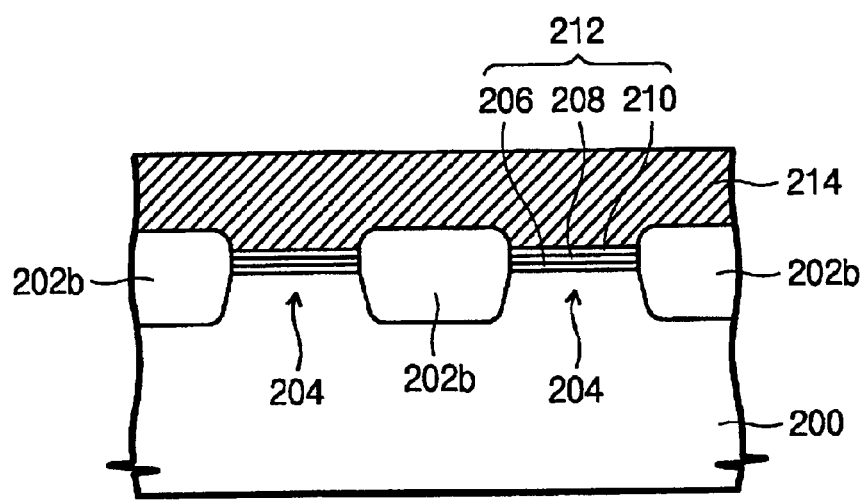

FIGS. 6A to 6C are cross-sectional views of sequential steps in the formation of an SONOS flash memory device shown in FIG. 3 in accordance with the other embodiment of the present invention taken along the line 3A–3A'.

First, referring to FIG. 6A corresponding to FIG. 5A, patterned layers (i.e., charge-storage layers 212, lower conductive layers 214a) exposing isolation regions, and an etching mask layer 216 are formed on a semiconductor substrate 200. A thermal oxide layer is formed on the exposed substrate by thermal oxidation, thereby forming isolation regions 202b as shown in FIG. 6B.

Then, the etching mask layer 216 is removed, and a conductive layer for a gate line is formed and patterned as the above described embodiment, forming the gate line 214 as shown in FIG. 6C.

With the present invention flash memory devices, disturbance from adjacent cells can be prevented because a charge-storage layer is formed only where a gate line intersects the active region, not on isolation regions for isolating the active region.

According to the method for forming the above structure, during the processing steps for forming isolation regions, a charge-storage layer is formed only on the active regions self-aligned with the isolation regions, thus simplifying manufacturing processes and save manufacturing costs.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A flash memory device comprising:
    adjacent isolation regions formed on a semiconductor substrate, the adjacent isolation regions defining an active region therebetween;
    a charge-storage dielectric layer formed only on the active region;
    a gate line overlying the charge-storage layer, the gate line intersecting the adjacent isolation regions and the active region;
    an impurity region formed on the active regions on both sides of the gate lines but not under the gate lines.

2. The flash memory device of claim 1, wherein the charge-storage dielectric layer includes a lower oxide layer, a nitride layer, and an upper oxide layer (ONO layer) sequentially staked on the semiconductor substrate.

3. The flash memory device of claim 1, wherein the gate line directly contacts the isolation regions.

4. The flash memory device of claim 1, wherein the charge-storage dielectric layer is formed on the active region self-aligned with the isolation region.

5. The flash memory device of claim 4, wherein the isolation region is trench isolation region.

6. The flash memory of claim 4, wherein the isolation region is trench isolation region.

7. A flash memory device comprising:
    a semiconductor substrate having first and second active regions, and an isolation region formed therebetween;
    charge-storage dielectric layers formed over the first and second active regions,
    wherein the charge-storage dielectric layer over the first active region is not connected to the charge-storage layer over the second active region;
    a gate line overlying the charge-storage layers, the gate line extending across the first and second active regions and the isolation region; and
    an impurity region formed on the active regions on both sides of the gate lines but not under the gate lines.

8. The flash memory of claim 7, wherein the charge-storage layer includes a lower oxide layer, a nitride layer, and an upper oxide layer (ONO layer) sequentially staked on the semiconductor substrate.

9. The flash memory device of claim 7, wherein the charge-storage dielectric layer over the first active region is formed self-aligned with the isolation region.

* * * * *

UNITED STATES PATENT AND TRADEMARK OFFICE
CERTIFICATE OF CORRECTION

PATENT NO. : 6,784,481 B2  
DATED : August 31, 2004  
INVENTOR(S) : Shin et al.

It is certified that error appears in the above-identified patent and that said Letters Patent is hereby corrected as shown below:

Title page,
Item [56], References Cited, U.S. PATENT DOCUMENTS,
"6,190,989 B1  2/2001  Roberts       438/264" should read
-- 6,190,969     2/2001  Lin et al     438/264 --.

Column 6,
Line 11, "an impurity region formed" should read -- a source/drain region formed --.
Line 11, "the active regions on" should read -- the active region on --.
Line 12, "gate lines but" should read -- gate line but --.
Line 12, " under the gate lines." should read -- under a middle portion of the gate line --.
Line 22, "flash memory device of" should read -- flash memory of --.
Lines 29-30, "therebetween; charge-storage dielectric layers formed" should read
-- therebetween; a charge-storage dielectric layer formed --.
Line 35, "storage layers, the" should read -- storage layer, the --.
Line 38, "an impurity region formed" should read -- source/drain regions formed --.
Line 40, "gate lines but" should read -- gate line but --.
Line 40, "under the gate lines." should read -- under a middle portion of the gate line. --.
Line 45, "flash memory device of" should read -- flash memory of --.

Signed and Sealed this

Thirty-first Day of May, 2005

JON W. DUDAS
*Director of the United States Patent and Trademark Office*